United States Patent
Apollonov et al.

[11] Patent Number: 5,930,279
[45] Date of Patent: Jul. 27, 1999

[54] DIODE LASER DEVICE ARRANGED IN THE FORM OF SEMICONDUCTOR ARRAYS

[75] Inventors: Victor Victorovich Apollonov; Gennadiy Ivanovich Babayants; Sergey Igorevich Derjavin; Batory Shakhimovich Kishmakhov; Yury Petrovich Koval; Vitaliy Vladimirovich Kuzminov; Dmitry Alecsandrovich Mashkovsky; Alexandr Mikhaylovich Prokhorov; Victor Pavlovich Smekalin, all of Moscow, Russian Federation; Jean Cornillault, Nozay, France

[73] Assignee: Compagnie Industrielle des Lasers Cilas, Marcoussis, France

[21] Appl. No.: 08/840,602

[22] Filed: Apr. 22, 1997

[30] Foreign Application Priority Data

Apr. 23, 1996 [RU] Russian Federation ............. 96108180

[51] Int. Cl.$^6$ ........................................ H01S 3/043
[52] U.S. Cl. .................. 372/50; 372/36; 372/48; 257/88
[58] Field of Search ................... 372/50, 36, 48; 257/84, 88, 95

[56] References Cited

U.S. PATENT DOCUMENTS

| | | | |
|---|---|---|---|
| 4,881,237 | 11/1989 | Donnelly | 372/50 |
| 5,349,210 | 9/1994 | Ackley et al. | 372/50 |
| 5,828,683 | 10/1998 | Freitas | 372/36 |

*Primary Examiner*—Rodney Bovernick
*Assistant Examiner*—Yisun Song
*Attorney, Agent, or Firm*—Marshall, O'Toole, Gerstein, Murray & Borun

[57] ABSTRACT

A diode laser device includes a heat diffusing substrate made from a material that is a good conductor of heat, in one face of which is formed a system of parallel ribs and grooves, the ribs being identical and equidistant, and a plurality of semiconductor arrays incorporating the diodes and housed longitudinally in the grooves. The grooves have an at least approximately triangular cross-section joined to the substrate by one side and each semiconductor array is fixed flat to an oblique flank of one of the ribs.

9 Claims, 4 Drawing Sheets

DIODE LASER DEVICE ARRANGED IN THE FORM OF SEMICONDUCTOR ARRAYS

BACKGROUND OF THE INVENTION

1. Field of the Invention

The present invention concerns a diode laser device in which diodes are arranged in a plurality of semiconductor arrays disposed parallel to each other and fixed to a heat diffusing substrate in turn connected to a cooling system. The laser diodes are grown epitaxially on semiconductor substrates which are cut into strips to form said laser diode arrays. A diode laser device of this kind is described in, for example:

I.E.E.E Journal of Quantum Electronics, Vol. 28, No. 4, April 1992, pages 952 to 965 "High Power Diode Laser Arrays" and pages 966 to 976 "Modular Microchannel Cooled Heatsinks for High Average Power Laser Diode Arrays; and U.S. Pat. No. 5,128,951.

2. Description of the Prior Art

Diode laser devices have many applications, for example pumping solid lasers (see U.S. Pat. No. 4,847,851), fiber optic links, laser treatment of materials, medicine, etc.

The diode laser devices known in themselves at this time and described in the prior art mentioned above are essentially of two types.

In the first type, the semiconductor arrays are welded flat onto one face of the heat diffusing substrate and this face is machined between two adjacent semiconductor arrays to form mirrors to reflect the radiation emitted by the diodes opposite said face. In an implementation of this kind the heat is extracted from said diodes efficiently, with the result that they operate reliably. On the other hand, it is not possible to obtain sufficiently dense and uniform radiation in this way.

In the second type of device known in itself one face of the heat diffusing substrate is provided with a system of parallel ribs and grooves of rectangular cross-section, said grooves forming housings in which said semiconductor arrays are disposed longitudinally on edge. An arrangement of this kind increases the density of the semiconductor arrays on the heat diffusing substrate, but does not provide a high density of radiation because the evacuation of heat is insufficient, given the small surface area of contact. The laser diodes therefore overheat and are quickly destroyed if a high radiation density is required.

An object of the present invention is to remedy these drawbacks by increasing the density and the uniformity of the radiation from a diode laser device. It increases thermal exchange between the arrays and the heat diffusing substrate and the service life of said diodes, simplifies the electrical connections of the semiconductor arrays and enables automated production of said device so that its manufacturing costs are reduced.

SUMMARY OF THE INVENTION

To this end, in accordance with the invention, a diode laser device includes:

a heat diffusing substrate made from a material that is a good conductor of heat, in one face of which is formed a system of parallel ribs and grooves, said ribs being identical and equidistant, and a plurality of semiconductor arrays incorporating said diodes and housed longitudinally in said grooves, wherein said grooves have an at least approximately triangular cross-section joined to said substrate by one side and each semiconductor array is fixed flat to an oblique flank of one of said ribs.

Advantageously, said two oblique flanks of each rib form between them a dihedral angle at least approximately equal to the divergence angle of said laser diodes, for example in the order of 60°.

Accordingly, because the laser diodes are disposed near the cooling surface of the massive base of the triangular ribs, good evacuation of the heat from the laser diode junctions is assured. Moreover, the light fluxes from said diodes disposed obliquely in this way overlap, which increases the density and the uniformity of the resulting radiation. This represents a reasonable compromise in respect of the density with which the surface of the diffusing substrate is covered by the semiconductor arrays.

To form connections between said diodes, said system of parallel ribs and grooves is coated with a metalization film to which said semiconductor arrays are fixed flat and said metalization film includes interruption strips parallel to said ribs and grooves.

These interruption strips are advantageously obtained by intentional destruction of the metalization film, which is initially uniform, at specific locations, for example in vertical alignment with the apexes of the ribs or in vertical alignment with the bottoms of the grooves.

Preferably, to improve the smoothness of the surface of the substrate and the electrical insulation between the laser diodes and said substrate, the device includes a film of a material that conducts heat but does not conduct electricity between said system of ribs and grooves and said metalization film.

In a first embodiment of the invention:

two semiconductor arrays are disposed in each groove, fixed flat to the facing divergent oblique flanks of said groove, said semiconductor arrays have the same type of conductivity, said interruption strips of said metalization film are in vertical alignment with apexes of said ribs, in each groove, a first conductor electrically connects to each other the two semiconductor arrays, and second conductors connect, each time, the first conductor of one groove to the part of said metalization film in the adjacent groove.

With an arrangement of this kind, the two semiconductor arrays of a groove are connected in parallel and the parallel combinations of the two arrays of all the grooves are connected in series.

In one embodiment of the invention:

a single semiconductor array is disposed in each groove so that all said semiconductor arrays of said device are fixed flat to parallel oblique flanks, said semiconductor arrays have the same type of conductivity, said interruption strips of said metalization film are in vertical alignment with said bases of said grooves, and in each groove, a conductor electrically connects said semiconductor array therein to the part of said metalization film covering said oblique flank opposite said oblique flank to which said semiconductor array is fixed.

In a device of this kind, all the semiconductor arrays are connected in series. The intensity of the radiation is slightly diminished compared to the first embodiment because the number of semiconductor arrays is halved, but the electrical connections are further simplified.

In another embodiment of the invention:

two semiconductor arrays are disposed in each groove, fixed flat to said divergent oblique flanks delimiting said groove, said two semiconductor arrays in a groove have opposite types of conductivity and all said semiconductor arrays having one type of conductivity are fixed to parallel oblique flanks, said interruption strips of said metalization film are in vertical alignment with said bases of said grooves, and in each groove, a conductor connects to each other said two semiconductor arrays having the opposite conductivity types.

In this way all of the semiconductor arrays are connected in series, without any connections other than those provided by the metalization film and said conductors last mentioned hereinabove.

It will be noted that, in the three embodiments described hereinabove, the structure requires few connections, with the result that the connection schematic is simple and fabrication can easily be automated.

The figures in the accompanying drawings show how the invention may be put into effect. In these figures, the same reference numbers denote similar components.

DETAILED DESCRIPTION OF THE PREFERRED EMBODIMENTS

Figure 1:
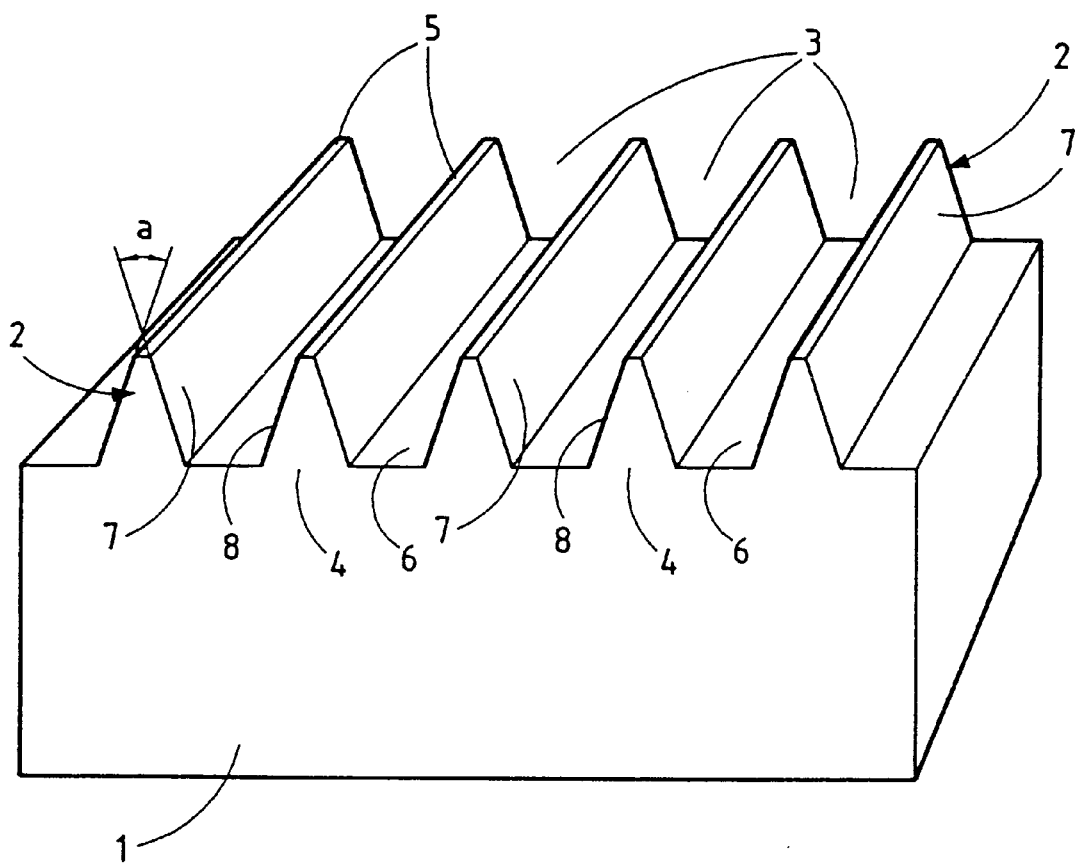
FIG. 1 is a perspective view of the heat diffusing substrate of the diode laser device in accordance with the present invention.

The heat diffusing substrate 1 for the diode laser device of the invention in FIG. 1 is in the form of a generally parallelepiped shape block made from a material that is a very good conductor of heat but preferably an insulator or a poor conductor of electricity, such as diamond, silicon carbide, beryllium oxide, etc. It is advantageous if it is rendered porous or provided with micro-channels by any method known in itself. The faces of the substrate 1 can be polished to a roughness of 3 nm or better. The substrate is mounted on a cooling system, not shown.

A system of parallel ribs 2 and grooves 3 is formed in one of the larger faces of the substrate 1, said ribs being identical and equidistant. In the particular example shown, this system includes five ribs 2 having an at least approximately triangular cross-section and four grooves 3 having an at least approximately trapezoidal cross-section, each groove 3 being defined by the space between two adjacent parallel ribs 2. Each rib 2 is joined to the substrate 1 by a wide base 4 and its apex 5, facing away from said substrate 1, can be truncated. Each groove 3 is open on the side opposite said substrate 1 and widens from its base 6. Each rib 2 has two plane, oblique and convergent flanks 7 and 8 with a dihedral angle a between them. Accordingly, each groove 3 is delimited by the divergent plane flanks 7 and 8 of two adjacent ribs 2.

Figure 2A:
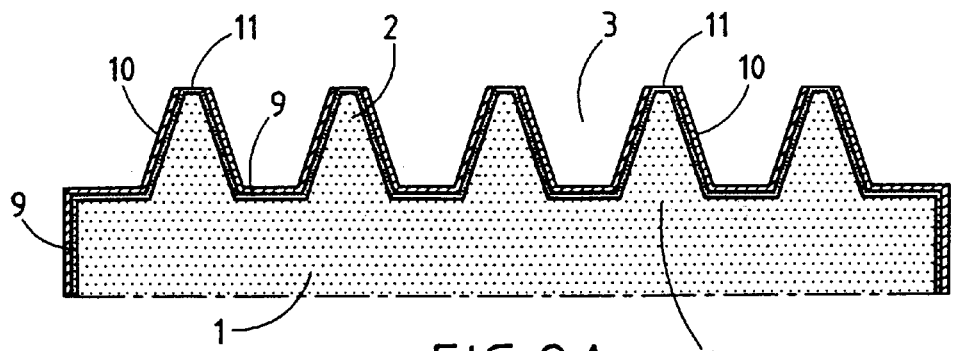
FIGS. 2A, 2B and 2C show a first embodiment of the diode laser device of the invention.
Figure 3A:
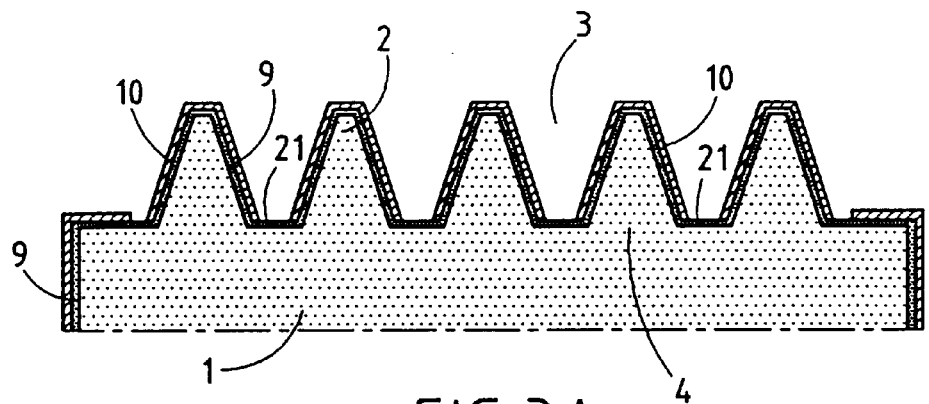
FIGS. 3A, 3B and 3C show a second embodiment of the diode laser device of the invention.
Figure 4A:
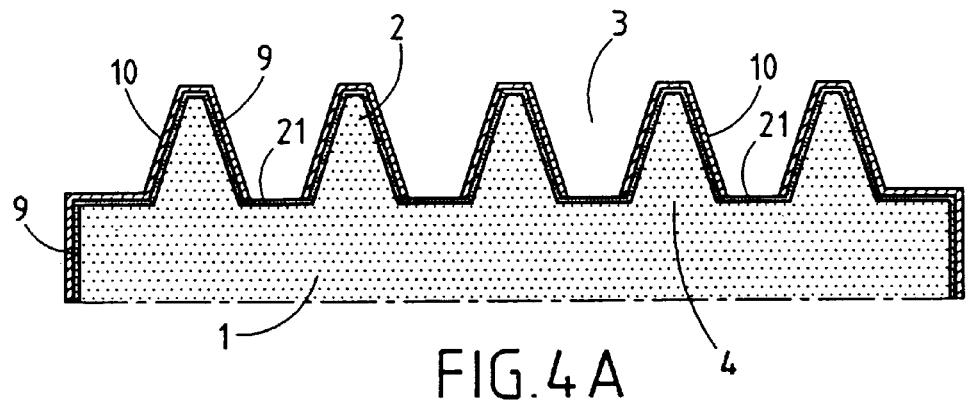
FIGS. 4A, 4B and 4C show a third embodiment of the diode laser device of the invention.

As shown in FIGS. 2A, 3A and 4A, at least the part of the substrate 1 carrying the ribs 2 and the grooves 3 is coated with a film 9 of a material that conducts heat but does not conduct electricity, such as silicon carbide. The film 9 covers the bases 6 of the grooves 3 and the apex 5 and the flanks 7 and 8 of the ribs 2. It can have a thickness in the order of 50 $\mu$m to 200 $\mu$m. In addition to its function of conducting heat, the film 9 is also intended to make the substrate 1 smoother.

As also shown in FIGS. 2A, 3A and 4A, the thermally conductive film 9 is covered by a metalization film 10 of, for example, chromium, titanium, nickel, gold, silver or an alloy of these metals. The metalization film 10 can have a thickness in the order of 50 $\mu$m to 200 $\mu$m.

Figure 2B:
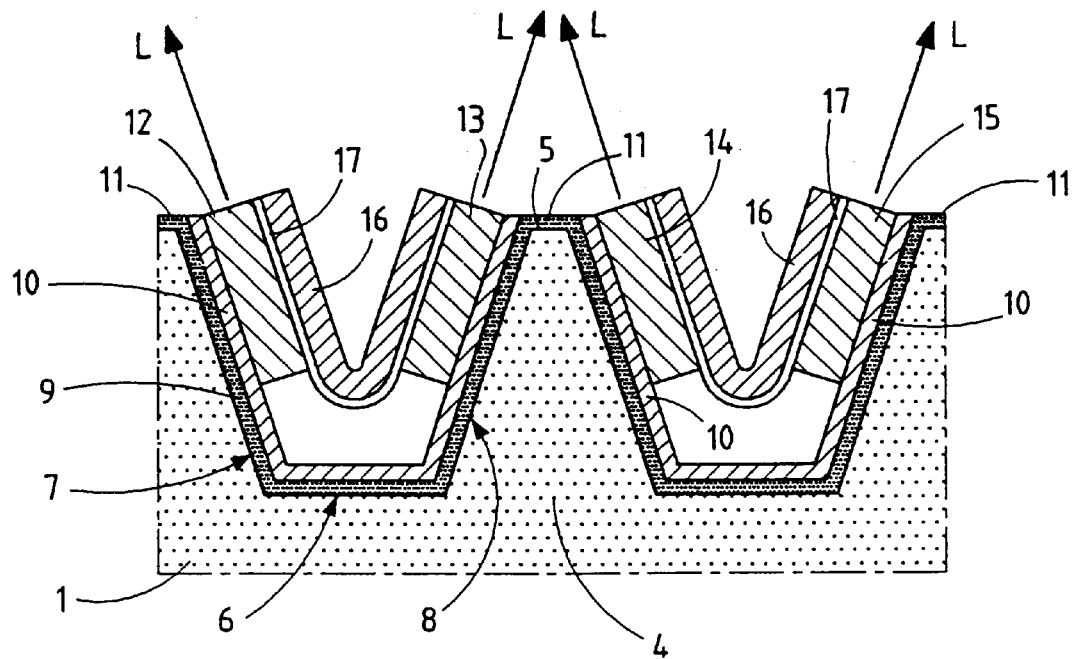
Figure 2C:
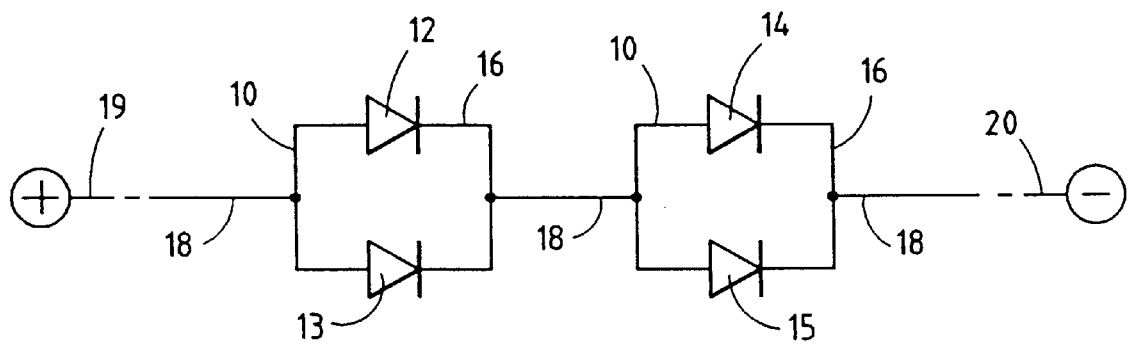

In the embodiment of FIGS. 2A, 2B and 2C the metalization film 10 covers the film 9 in vertical alignment with the bases 6 of the grooves 3 and the flanks 7 and 8 of the ribs 2, but is destroyed in vertical alignment with the apexes 5 of the latter. Accordingly, in corresponding relationship to said apexes 5, the film 10 is interrupted along strips 11 in which the film 9 is exposed.

As shown in FIG. 2B, which corresponds to an enlarged fragment of FIG. 1 showing two adjacent grooves 3 on opposite sides of a rib 2, two semiconductor arrays carrying laser diodes are mounted in each of said grooves 3. These semiconductor arrays are identified by the reference numbers 12 and 13 for one of the grooves 3 and the reference numbers 14 and 15 for the other of said grooves. Each of the semiconductor arrays 12 through 15 is of the n type and is fixed flat to the side of the substrate on the part of the metalization film 10 that covers either an oblique flank 7 or an oblique flank 8, for example by soldering using a low melting point solder such as indium, tin or gold. Accordingly, in each groove 3 one semiconductor array 12 or 14 is carried by the corresponding oblique flank 7 and the other semiconductor array 13 or 15 is carried by the associated oblique flank 8, so that the two semiconductor arrays of a groove, 12 and 13 on the one hand and 14 and 15 on the other hand, are electrically connected to each other via their fixing faces by the parts of the metalization film 10 covering the base 6 and the oblique flanks 7 and 8. In each groove 3 a V-shape electrically conductive strip 16, for example a metal (copper) strip, having a thickness between 50 $\mu$m and 200 $\mu$m electrically connects the faces of the corresponding semiconductor arrays 12 and 13 or 14 and 15 opposite the fixing faces of the latter. A thermally and electrically conductive attachment layer 17 may be provided between the conductive strips 16 and the diodes 12 through 15.

As shown in FIG. 2C, the semiconductor strip 12 is electrically connected in parallel with the semiconductor array 13, on the one hand through the metalization film 10 covering the corresponding groove 3 and on the other hand through the associated conductive strip 16. Similarly, the semiconductor array 14 is electrically connected in parallel with the semiconductor array 15, on the one hand through the metalization film 10 covering the corresponding groove 3 and on the other hand through the associated conductive strip 16. The parallel connections of the arrays 12 and 13 on the one hand and 14 and 15 on the other hand can be connected in series by a conductor 18 connecting the strip 16 of the diodes 12 and 13 to the part of the film 10 associated with the diodes 14 and 15. A conductor 18 of this kind is shown in FIG. 2C but not in FIG. 2B.

From the foregoing description, it will readily be understood that the parallel-series arrangement just described for the four semiconductor arrays of two adjacent grooves applies to all of the semiconductor arrays of the device. At the ends of the overall parallel-series arrangement a conductor 19 connects the +pole of an electrical power supply to the film 10 of the first pair of arrays in parallel and a conductor 20 connects the conductive strip 16 of the last pair of arrays in parallel to the −pole of an electrical power supply.

Figure 3B:
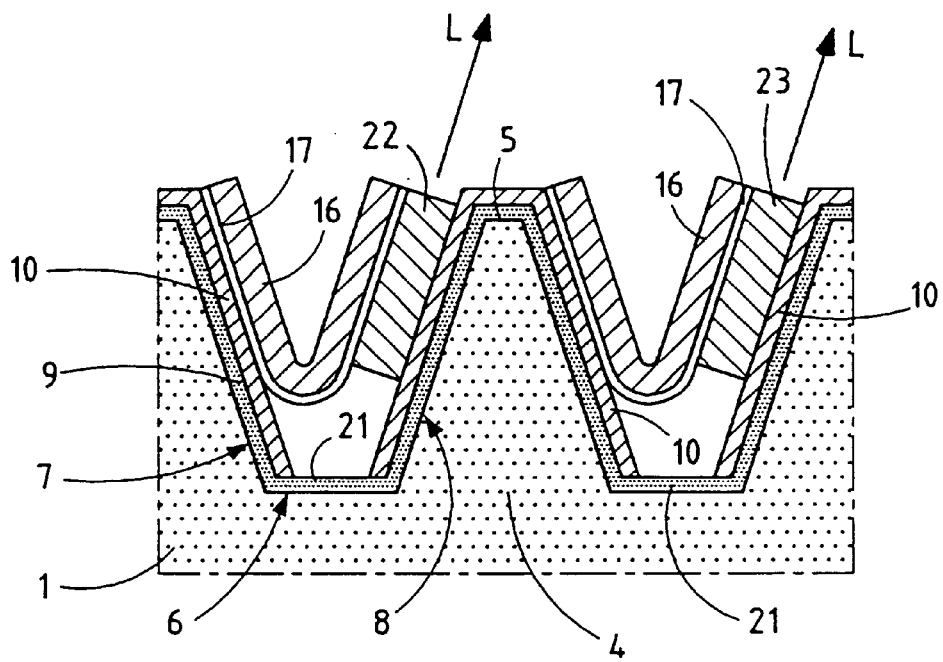
Figure 3C:
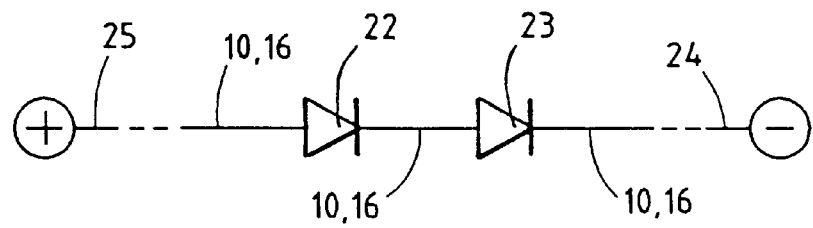

In the embodiment of FIGS. 3A, 3B and 3C (which respectively correspond to FIGS. 2A, 2B and 2C), the metalization film 10 covers the film 9 in vertical alignment with the apexes 5 and the oblique flanks 7 and 8 of the ribs 2, but not in vertical alignment with the bases 6 of the grooves 3. Consequently, in corresponding relationship with the bases 6, the film 10 is interrupted along strips 21 in which the film 9 is exposed.

Moreover, in this latter embodiment only one semiconductor array carrying laser diodes is mounted in each of said grooves 3. In FIG. 3B, this array is identified by the reference number 22 for one of the grooves 3 and the reference number 23 for the adjacent groove 3. The semiconductor arrays 22 and 23 are of the n type and each of them is fixed to the oblique face 8 of the groove 3 in which it is located, as described hereinabove with reference to the arrays 13 and 15. In this embodiment, each V-shape electrically conductive strip 16 electrically connects the face of the array 22 or 23 opposite the fixing face of the latter to the part of the metalization film 10 covering the corresponding oblique face 7.

Accordingly, as shown in FIG. 3C, the two semiconductor arrays 22 and 23 are connected in series by the conductive strip 16 associated with the array 23 and the part of the metalization film 10 covering the rib 2 separating said arrays.

This series connection of two semiconductor arrays of two adjacent grooves can of course be generalized to all of the arrays of the device. At the ends of the overall series arrangement, conductors 24 and 25 are provided to connect said arrangement to the +pole and to the –pole, respectively, of an electrical power supply.

Figure 4B:
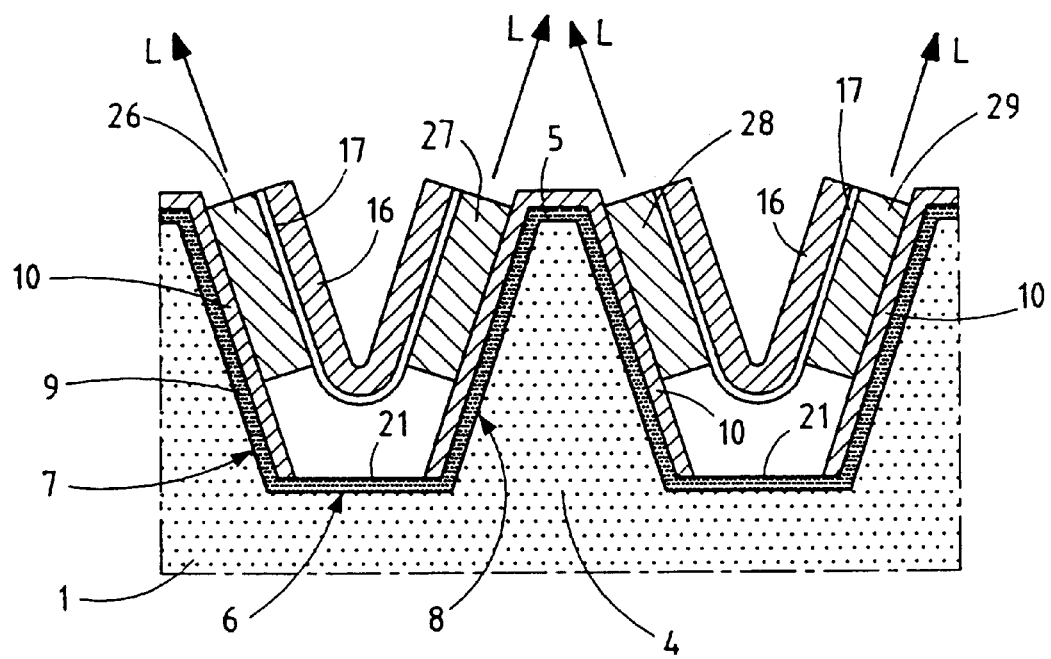
Figure 4C:
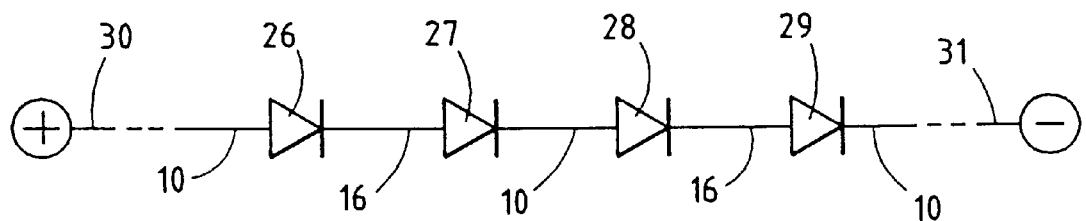

In the embodiment of FIGS. 4A, 4B and 4C (which respectively correspond to FIGS. 2A, 2B and 2C), the metalization film 10 is similar to that of FIGS. 3A, 3B and 3C and includes interruption strips 21 in corresponding relationship to the bases 6 of the grooves 3. In this embodiment, each groove 3 contains two semiconductor arrays 26 and 27 or 28 and 29, respectively, arranged in exactly the same way as the semiconductor arrays 12 and 13 or 14 and 15 of FIG. 2B. However, in this case, the semiconductor arrays 26 and 28 on the oblique faces 7 are of the n type and the semiconductor arrays 27 and 29 on the oblique faces 8 are of the p type.

As shown in FIG. 4C, the two arrays 26 and 27, which have opposite conductivity types, are connected in series by a corresponding V-shape conductive strip 16. Likewise the two arrays 28 and 29. Moreover, the arrays 27 and 28, which also have opposite conductivity types, are connected to each other in series by the part of the metalization film 10 covering the rib 2 separating the two adjacent grooves 3. Consequently, as shown in FIG. 4C, the four semiconductor arrays 26 through 29 are connected in series by virtue of their alternating conductivity type and electrical connections made alternately by the metalization film 10 and by the electrically conductive strips 16.

It will readily be understood that a series arrangement of the four semiconductor arrays of two adjacent grooves 3 of this kind can be extended to all of the arrays of the device. At the ends of the complete series arrangement, conductors 30 and 31 (see FIG. 4C) connect said arrangement respectively to the +pole and the –pole of an electrical power supply.

In FIGS. 2B, 3B and 4B the radiation from the diodes of the semiconductor arrays is shown by arrows L. The dihedral angle a of the plane oblique flanks 7 and 8 of the ribs 2 is defined by the divergence of the radiation L from the laser diodes.

By an appropriate choice of the value of this angle a, it is possible to obtain a maximum uniformity of the radiation at a certain distance from the device. By varying the angle a the number of laser diode arrays per unit surface area of the substrate may be increased or reduced. The apexes 5 of the ribs and the bases 6 of the grooves may be sharp, flat or rounded. Their appearance is determined by the method of electrically connecting the laser diode arrays.

The oblique flanks 7 and 8 of the ribs 2 can have a width greater than that of a laser diode array (~0.5 mm). From the technological point of view it is convenient for it to be greater than 0.8 mm–1.0 mm. If the angle a is equal to 60° (a typical value for the divergence angle of laser diode radiation), up to 20 laser diode arrays may be disposed over a length of 1 cm.

The thickness of the metalization film 10 and of the connecting strip 16 is made between 50 $\mu$m and 200 $\mu$m so that the strips can readily carry currents of up to 100 A for periods of 200 $\mu$s to 400 $\mu$s.

The structure of the laser diode device of the invention enables automatic production employing a template having the same profile as the laser diode arrays.

The side of the laser diode arrays facing towards the bottom 6 of the grooves 3 is advantageously covered with a totally reflecting layer so that the radiation is directed only outwards.

The heat diffusing substrate 1 is fixed (for example glued) to a cooling system (not shown), for example of the circulating fluid type. The substrate can have a porous or microchannel structure through which a cooling liquid is passed.

It will be noted that by assembling a plurality of devices in accordance with the invention it is possible to obtain a laser diode matrix of any size.

There is claimed:

1. A diode laser device comprising:
    a heat diffusing substrate made from a material that is a conductor of heat, in one face of which is formed a system of parallel ribs and grooves, said grooves having an at least approximately triangular cross-section joined to said substrate by one side;
    a metallization film coating said system of parallel ribs and grooves and including interruption strips parallel to said ribs and grooves; and
    a plurality of semiconductor arrays incorporating laser diodes and housed longitudinally in said grooves, each semiconductor array being fixed flat to an oblique flank of one of said ribs by means of said metallization film.

2. The device claimed in claim 1 wherein said two oblique flanks of each rib form between them a dihedral angle equal to the divergence angle of said laser diodes.

3. The device claimed in claim 1 wherein said dihedral angle is in the order of 60°.

4. A device as claimed in claim 1 including a film of a material that conducts heat but does not conduct electricity between said system of ribs and grooves and said metalization film.

5. The device claimed in claim 1 wherein:
    two semiconductor arrays are disposed in each groove, fixed flat to the facing divergent oblique flanks of said groove, said semiconductor arrays have the same type of conductivity, said interruption strips of said metalization film are in vertical alignment with apexes of said ribs, in each groove, a first conductor electrically connects to each other the two semiconductor arrays, and second conductors connect, each time, the first conductor of one groove to the part of said metalization film in the adjacent groove.

6. The device claimed in claim 1 wherein:

a single semiconductor array is disposed in each groove so that all said semiconductor arrays of said device are fixed flat to parallel oblique flanks, said semiconductor arrays have the same type of conductivity, said interruption strips of said metalization film are in vertical alignment with said bases of said grooves, and in each groove, a conductor electrically connects said semiconductor array therein to the part of said metalization film covering said oblique flank opposite said oblique flank to which said semiconductor array is fixed.

7. The device claimed in claim 1, wherein:

two semiconductor arrays are disposed in each groove, fixed flat to said divergent oblique flanks delimiting said groove, said two semiconductor arrays in a groove have opposite types of conductivity and all said semiconductor arrays having one type of conductivity are fixed to parallel oblique flanks, said interruption strips of said metalization film are in vertical alignment with said bases of said grooves, and in each groove, a conductor connects to each other said two semiconductor arrays having the opposite conductivity types.

8. The device claimed in claim 1 wherein the thickness of said metalization film is between 50 $\mu$m and 200 $\mu$m.

9. The device claimed in claim 5 wherein said conductors are in the form of strips the thickness of which is between 50 $\mu$m and 200 $\mu$m.

* * * * *